United States Patent
Nguyen et al.

(10) Patent No.: US 6,352,881 B1
(45) Date of Patent: Mar. 5, 2002

(54) METHOD AND APPARATUS FOR FORMING AN UNDERFILL ADHESIVE LAYER

(75) Inventors: Luu Nguyen, Sunnyvale; Nikhil Kelkar, Santa Clara; Christopher Quentin, Fremont; Ashok Prabhu, Sunnyvale; Hem P. Takiar, Fremont, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/359,214

(22) Filed: Jul. 22, 1999

(51) Int. Cl.⁷ .................. H01L 21/44; H01L 21/48; H01L 21/50
(52) U.S. Cl. ............... 438/108; 438/114; 438/118; 438/612; 257/758; 257/783; 257/778; 257/779
(58) Field of Search .................. 438/612, 108, 438/118, 113, 114; 257/737, 738, 778, 780, 788, 790, 792, 793, 777, 779, 783, 789, 791

(56) References Cited

U.S. PATENT DOCUMENTS

| | | | | |
|---|---|---|---|---|
| 5,668,059 A | * | 9/1997 | Christie et al. | 438/118 |
| 5,953,623 A | * | 9/1999 | Boyko et al. | 438/612 |
| 5,895,976 A | * | 4/2000 | Morrell et al. | 257/778 |
| 6,060,373 A | * | 5/2000 | Saitoh | 438/459 |
| 6,063,647 A | * | 5/2000 | Chen et al. | 438/108 |
| 6,071,757 A | * | 6/2000 | Fogal et al. | 438/110 |
| 6,121,689 A | * | 9/2000 | Capote et al. | 257/783 |

* cited by examiner

*Primary Examiner*—Wael Fahmy
*Assistant Examiner*—Fernando Toledo
(74) *Attorney, Agent, or Firm*—Beyer Weaver & Thomas LLP

(57) ABSTRACT

A method and apparatus for forming a layer of underfill adhesive on an integrated circuit located on a wafer surface are described. As a flip chip, the integrated circuit has electrically conductive pads, most of which have a solder ball attached thereto. A layer of underfill adhesive is then formed on the wafer surface such that at least some portion of most of the solder balls remain uncovered. The layer of underfill adhesive is partially cured and the flip chip is then mounted onto a substrate. A solder reflow operation electrically couples the flip chip and the substrate as well as fully cures the underfill adhesive.

8 Claims, 7 Drawing Sheets

METHOD AND APPARATUS FOR FORMING AN UNDERFILL ADHESIVE LAYER

FIELD OF THE INVENTION

The present invention relates generally to flip chip packaging for integrated circuits. More particularly, it relates to flip chips that have an integral layer of underfill material and to methods for making such flip chips.

BACKGROUND OF THE INVENTION

There are a number of conventional processes for packaging integrated circuits. One approach which is commonly referred to as "flip chip" packaging generally contemplates forming solder bumps (or other suitable contacts) directly on I/O pads formed on an integrated circuit die. The die is then typically attached to a substrate such as printed circuit board or package substrate such that the die contacts directly connect to corresponding contacts on the substrate. That is, the die is placed on the substrate with the contact bumps facing corresponding contacts on the substrate. The solder contact bumps are then reflowed to electrically connect the die to the substrate.

When a flip chip is attached to the substrate, an air gap typically remains between flip chip and substrate. This gap is commonly filled with material that is flowed into the gap in liquid form and is then solidified. This material is generally a mixture of a resin and small silica spheres and is generally called underfill. The underfill material is typically applied in liquid form from a dispenser at one edge of a flip chip. The material then flows into the narrow gap and spreads across the flip chip until finally the entire area of the gap between flip chip and substrate is filled.

There are problems associated with underfill. For example, the operation of applying underfill must be repeated for each flip chip. Repeating such an operation many times adds to the cost of manufacture. Also, as the underfill material flows past solder bumps to fill the gap, separation of glass from resin may occur. The separation of silica spheres from the resin occurs as some silica spheres become trapped as they meet solder ball obstacles. The underfill material will develop streaks of high and low silica concentration. The silica may also separate from the resin by sinking to one side of the gap, thus creating a silica rich side in the bottom and a resin rich side on the top of the gap. This segregation of silica and resin alters the mechanical properties of the filled region and thereby negates the mechanical function of the underfill.

Therefore there is a need for a lower cost underfill application process and there is a need to reduce the amount of silica segregation that occurs.

SUMMARY OF THE INVENTION

To achieve the foregoing and other objects and in accordance with the purpose of the present invention, methods for forming a layer of underfill adhesive on an integrated circuit located on an active surface of a wafer are disclosed. In one embodiment, the integrated circuit has solder bumped electrically conductive pads. A layer of underfill adhesive is deposited on the active surface of the wafer in such a way that at least a portion of most of the solder balls remain uncovered. The deposited layer of underfill adhesive is then partially cured.

In a preferred embodiment, the integrated circuit is a singulated flip chip that is mounted on a substrate by directly aligning selected ones of solder bumped flip chip bond pads to corresponding substrate bond pads. The flip chip is electrically connected to the substrate by a solder reflow operation that also finally cures the underfill adhesive.

In another embodiment, a flip chip integrated circuit package is disclosed. The flip chip integrated circuit package includes a substrate having a plurality of substrate bond pads suitable for being electrically coupled to external circuitry. The flip chip integrated circuit package also includes a flip chip integrated circuit having flip chip bond pads. Some of flip chip bond pads have solder balls and are directly aligned to and in direct contact with corresponding substrate bond pads by way of the associated reflowed solder balls. A substantially uniform layer of underfill adhesive is juxtaposed between the substrate and the flip chip integrated circuit.

In yet another embodiment, an apparatus for forming a layer of underfill adhesive on an integrated circuit having electrically conductive pads located on an active surface of a wafer is disclosed. The apparatus includes a means for forming a solder ball on most of the electrically conductive pads and a means for forming the layer of underfill adhesive on the active surface of the wafer, wherein at least some portion of most of the solder balls remain uncovered. The apparatus also includes a means for partially curing the underfill adhesive and a means for singulating the integrated circuit. The apparatus also includes a means for reflowing the solder balls such that the reflowing fully cures the underfill adhesive.

In still another embodiment of the invention, a method for forming a layer of underfill adhesive on an integrated circuit is described. A solder ball is formed on most of the electrically conductive pads included on an active surface of the integrated circuit. A layer of underfill adhesive is then formed on the active surface of the integrated circuit such that at least some portion of most of the solder balls remain uncovered. The layer of underfill adhesive is then partially cured. The underfill adhesive is finally cured during a subsequent solder reflow operation.

BRIEF DESCRIPTION OF THE DRAWINGS

The features of the present invention may best be understood by reference to the following description of the presently preferred embodiments together with the accompanying drawings. For the sake of clarity the drawings are not to scale.

DETAILED DESCRIPTION OF THE INVENTION

In the following description, numerous specific details are set forth in order to provide a thorough understanding of the present invention. In view of this description, it will be obvious to one skilled in the art that the present invention may be embodied in a wide variety of specific configurations. Also, in order not to unnecessarily obscure the present invention, well-known integrated circuit manufacturing steps are not described herein in detail.

The present invention will be described in terms of a flip chip style integrated circuit suitable for forming a flip chip package. In one embodiment, a layer of underfill adhesive is formed on an integrated circuit located on a first surface of a wafer. In one implementation, the integrated circuit is a flip chip integrated circuit having electrically conductive pads, most of which have solder bumped so as to have a solder ball attached thereto. A layer of underfill adhesive is then deposited on the first surface of the wafer in such a way that at least some portion of most of the solder balls remain uncovered. The deposited layer of underfill adhesive is then partially cured during pre-cure. During a solder reflow operation, the flip chip is electrically connected to a substrate which also finally cures the underfill adhesive.

In one implementation, selected portions of the wafer are left uncovered by the underfill adhesive using, for example, masking techniques well known in the art. One such technique is screen printing. In this way, the uncovered portions provide thermal stress relief induced by the first solder reflow. The uncovered portions also provide singulation guides used when singulating the wafer.

In another embodiment, a substantially uniform layer of underfill is applied prior to solder bumping leaving most of the underbump metallization pads uncovered. Solder bumps are then applied to the exposed underbump metallization after which a pre-cure is performed. The underfill adhesive is finally cured during a subsequent solder reflow operation.

Figure 1A:
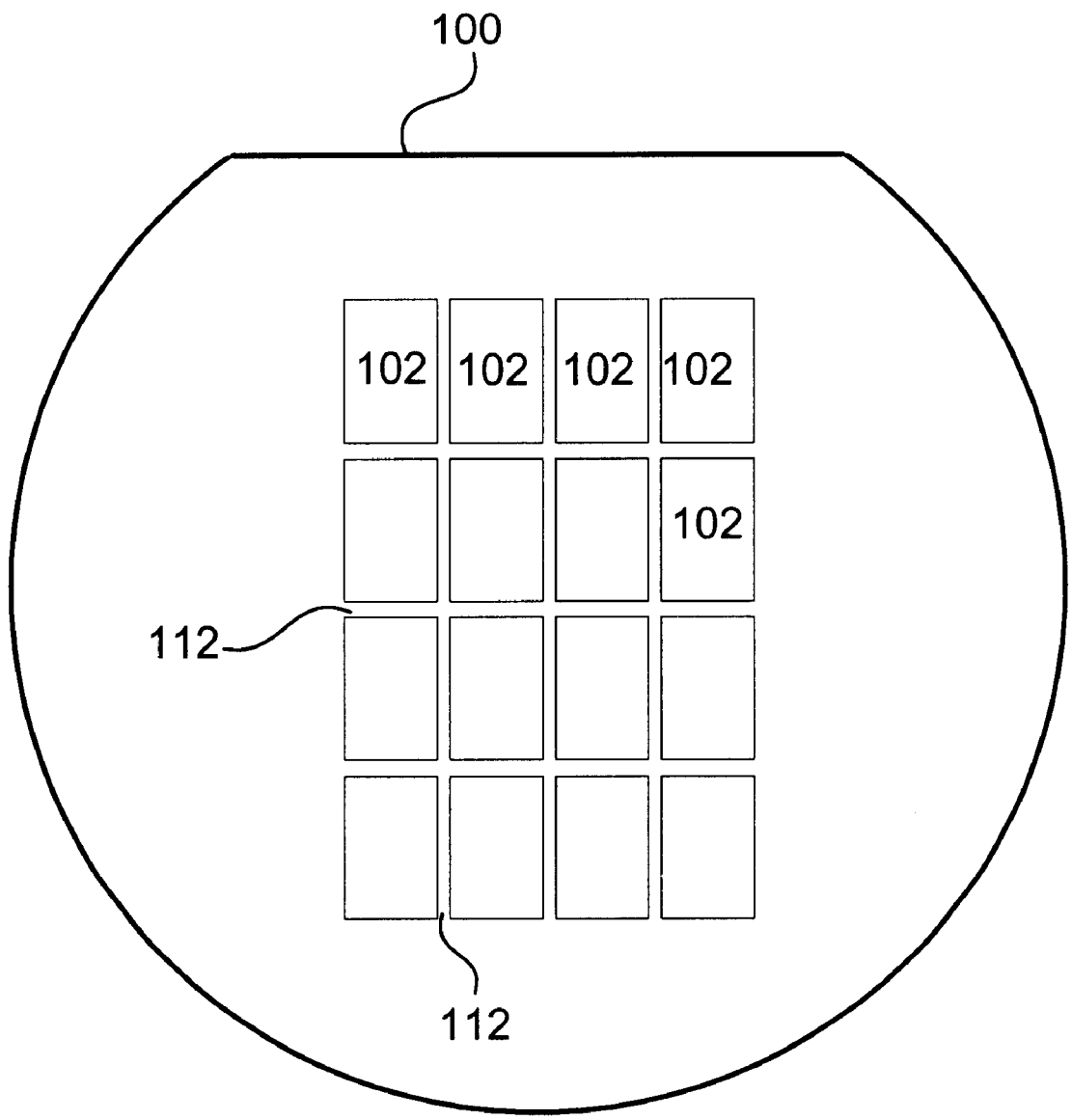
FIGS. 1(a)–1(g) illustrate cross sections of a portion of a wafer at various stages in the process of forming a layer of underfill material on a wafer in accordance with an embodiment of the invention.
Figure 1B:
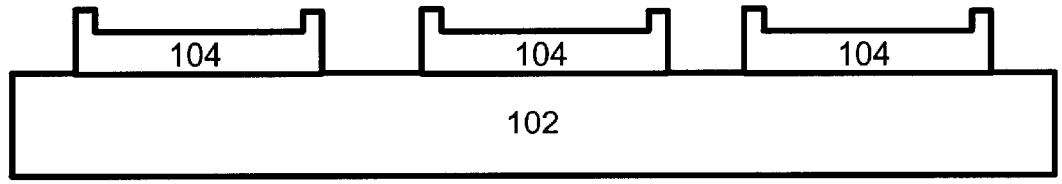

Referring now to FIGS. 1(a)–1(f) illustrating a process for forming an underfill layer on a wafer in accordance with an embodiment of the invention. FIG. 1(a) shows a top view of a wafer 100 having a number of flip chip dies 102 included thereon in accordance with an embodiment of the invention. It should be noted that most wafers are formed of silicon dioxide but can, of course, be formed of any appropriate semiconductor material including, for example, gallium arsenide (GaAs). One such flip chip die 102 is shown in cross section in FIG. 1(b) having a number of underbump metallization pads 104. The underbump metallization pads 104 are used to electrically couple the flip chip die 102 to external circuitry. In most flip chip package arrangements, the flip chip die 102 is bonded directly to a substrate having electrical interconnects which act as an electrical conduit to the external circuit.

Figure 1C:
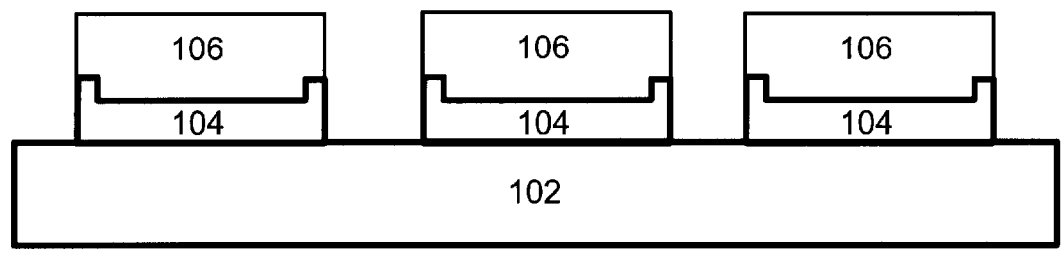
Figure 1D:
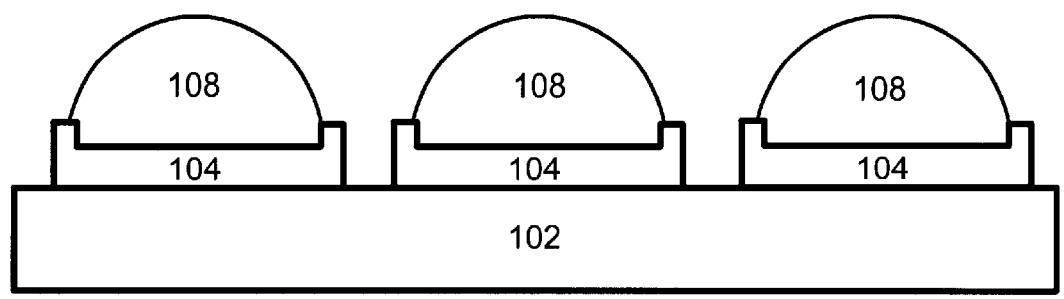

In order to form the electrical connection, however, what is referred to as solder paste is applied to each underbump metallization pad 102 in the form of a solder paste island 106 as shown in FIG. 1(c). As illustrated in FIG. 1(d), once the solder paste islands 106 are in place, corresponding solder balls 108 are formed during what is referred to as a first solder reflow operation well known to those in the art. During the first solder reflow operation, the wafer 100 is thermally processed using well known techniques that result in the flowing of solder paste island 106 to form the solder ball 108. It is important to note that the underbump metallization pad 104 provides a barrier to the lateral flow of the solder paste during the solder reflow operation. The underbump metallization pad 104 also provides a metal barrier between the solder ball 108 and the flip chip die 102.

Figure 1E:
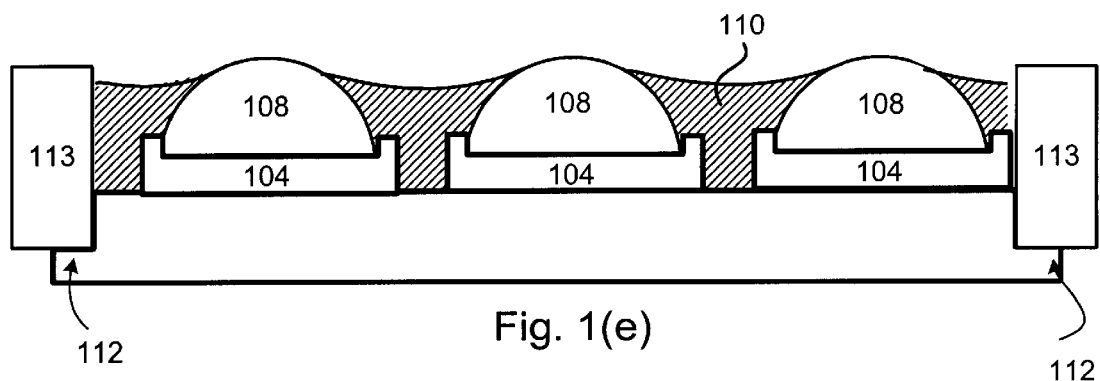

After the solder ball 108 has been formed, a layer of underfill adhesive 110 is applied to the wafer 100 using, in one embodiment, well known masking techniques to prevent the underfill layer from filling, or printing, into saw streets 112 as shown in FIG. 1(e). Referring back to FIG. 1(a), the saw streets 112 are used to facilitate the singulation of the individual dies 102 from the wafer 100. Turning back to FIG. 1(e), by preventing the underfill adhesive from filling the saw streets 112 by using, for example, a screen printing mask, stresses induced in the wafer 100 by the subsequent curing of the underfill are substantially eliminated. In this way, the problems related to wafer warpage (i.e., such as difficulty in sawing the dies) are greatly reduced. Since the screen printing mask can be designed to prevent underfill from being printed into the saw streets 112, the mask can also be designed to print underfill in the saw streets 112, or into any selected ones of the many saw streets on the wafer 100.

Figure 1F:
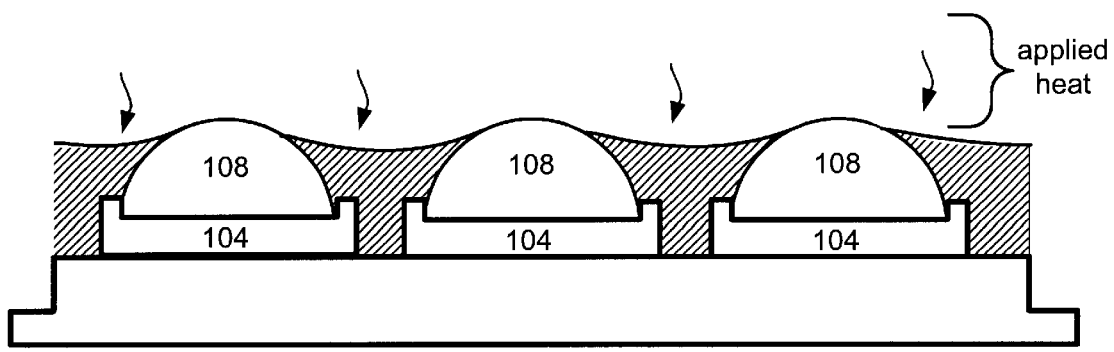

As shown in FIG. 1(f), during what is referred to as soft or pre-cure operation, the wafer 100 is thermally processed in such a manner that the surface of the underfill layer 110 becomes essentially non-sticky. Since the underfill layer 110 is soft cured (or gelled) at an elevated temperature, the return of the wafer 100 to ambient conditions during subsequent assembly operations results in thennally induced shear stresses between the wafer 100 and the underfill layer 110 in proportion to the thickness of the underfill layer 110. It is for at least this reason that for solder balls that are 130 microns high before assembly and 100 microns high after assembly, an underfill layer of up to approximately 100 microns thick is desirable.

Figure 1G:
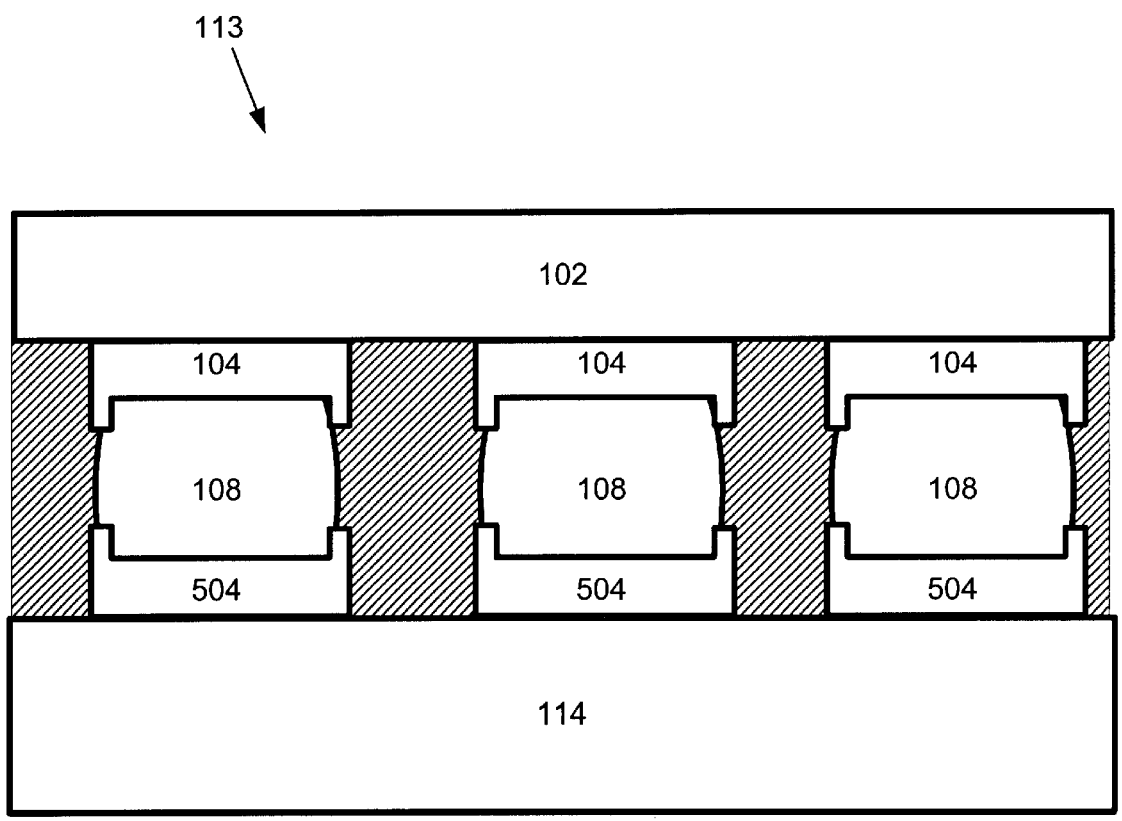

FIG. 1(g) shows a pre-packaged singulated flip chip 113 formed by the singulated flip chip 102 being aligned to and mounted on a substrate 114. A second solder reflow operation is performed which causes the solder balls 108 to flow in such a manner as to electrically connect the pad 104 to corresponding substrate pads 504. In this way, the flip chip 102 is capable of communication with external circuitry coupled to the substrate 114. It should be noted that it is during the second solder reflow that the underfill adhesive is finally cured.

In one embodiment of the invention, the underfill layer 110 is formed of a silica filled polymer resin having dual stage curing chemistry with specific, uncured, pre-cured, and fully cured properties, having, for example, an initial viscosity in the range of approximately 3,000 to approximately 300,000 cP. Examples of such a resin include: epoxy based, poly-imide based, or silicone-polyimide based materials.

Once the underfill material is cured, it should have specific thermal and mechanical properties to reduce the effects of thermal stresses without adversely affecting thermal performance of the flip chip. The cured underfill material should have an elastic modulus in the range of 1 to 10 GPa. A mismatch between the coefficient of thermal expansion of the flip chip and the substrate on which the flip chip is attached exerts a shear stress on the solder joint. The function of the underfill is to provide additional (high strength) material in the plane of the solderjoints across which the stresses can be distributed. Modulus values in the range 1 to 10 GPa specified above allow the underfill to distribute these stresses without exceeding the fracture strength of the silicon.

The underfill should have a coefficient of thermal expansion (CTE) in the range of approximately $20 \times 10^{-6}/K$ to approximately $30 \times 10^{-6}/K$ @ 25° C. In order to reduce thermally induced stress, the coefficient of thermal expansion value of typical solders is also in this range. By having close agreement between the CTE values of these materials minimizes the generation of shear stresses between the underfill and the solder joints. One advantage to reducing thermal stress is that the overall reliability of the electrical connection formed by the solder joint is greatly enhanced.

Figure 2:
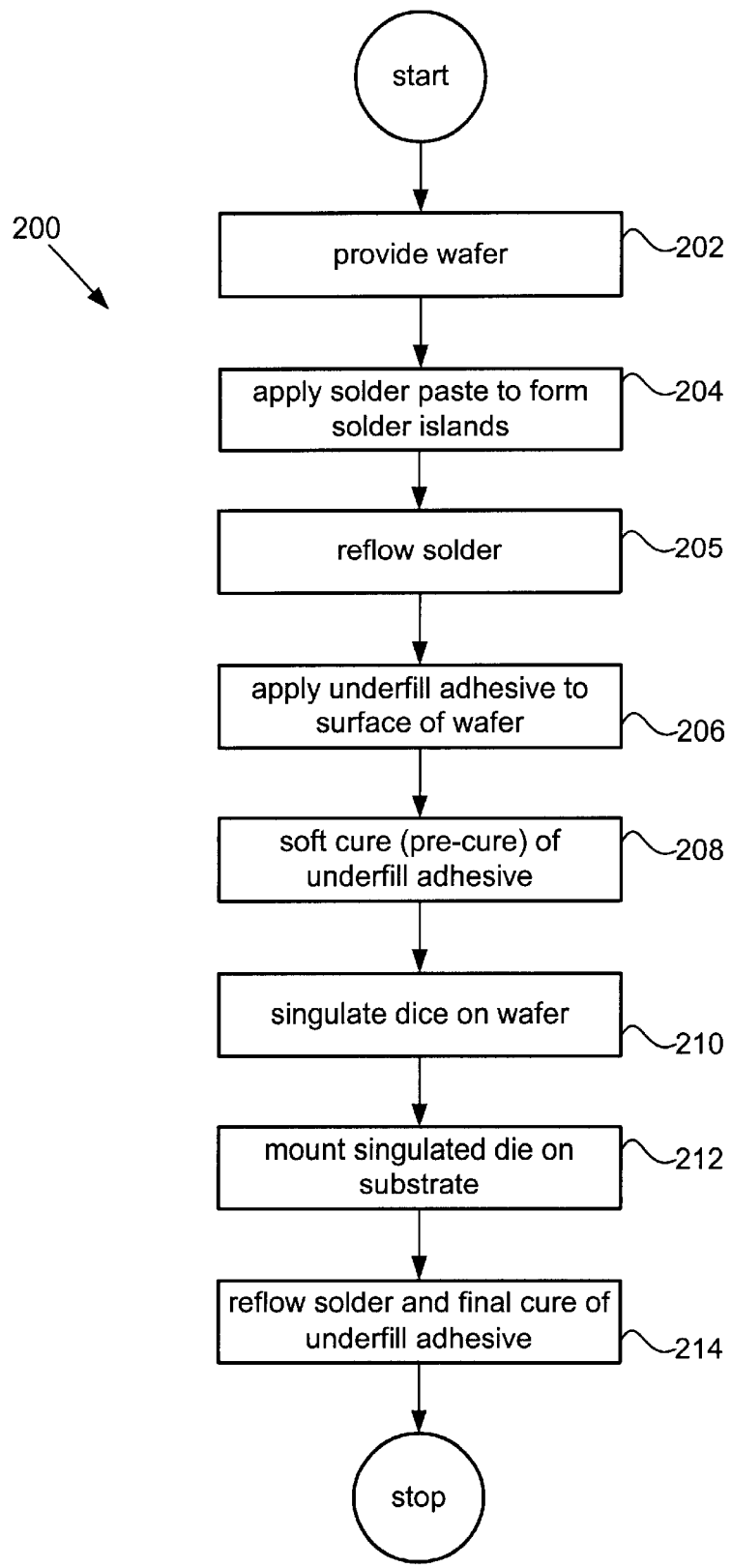
FIG. 2 is a flowchart detailing the process for forming a layer of underfill material on the portion of the wafer shown in FIG. 1.

Referring now to FIG. 2, a flowchart detailing a process 200 for forming an underfill layer in accordance with an embodiment of the invention is presented. The process 200 begins, in one implementation, at 202 by providing a semiconductor wafer having an active surface that is populated by a number of integrated circuits each having a number of underbump metallization pads. Typically, some of the integrated circuits are flip chip type integrated circuits used to form packaged flip chip integrated circuits. At 204, solder paste, in the form of solder paste islands, is applied to each of the underbump metallization pads. At 205, the solder paste islands are then thermally processed during what is referred to as a first solder reflow to form solder balls. At 206, an underfill adhesive layer is applied to the active wafer surface surrounding most of the solder balls. In one embodiment, the underfill layer is prevented from filling saw streets delineating the individual integrated circuits on the wafer using well known masking techniques.

In one implementation, a screen print is applied to the wafer surface prior to the application of the underfill layer preventing, thereby, the filling of the saw streets by the underfill material. In this way, subsequent sawing operations to singulate the integrated circuits are aided by the saw streets acting as saw guides. In addition, the absence of underfill material in the saw streets substantially reduces thermally induced stress on the wafer which commensurably reduces wafer warpage. By reducing wafer warpage, overall production yield is improved by reducing, for example, die loss due to binding of the wafer saw. Once the underfill layer has been formed, the underfill layer is soft cured at 208 after which, at 210, the integrated circuit dies are then singulated. It should be noted, that when the singulated dies are subsequently die attached to a substrate at 212, for example, the underfill is then fully cured by thermal processing used to reflow the solder balls in a second solder reflow at 214 so as to electrically couple the flip chip integrated circuit to the substrate.

Figure 3A:
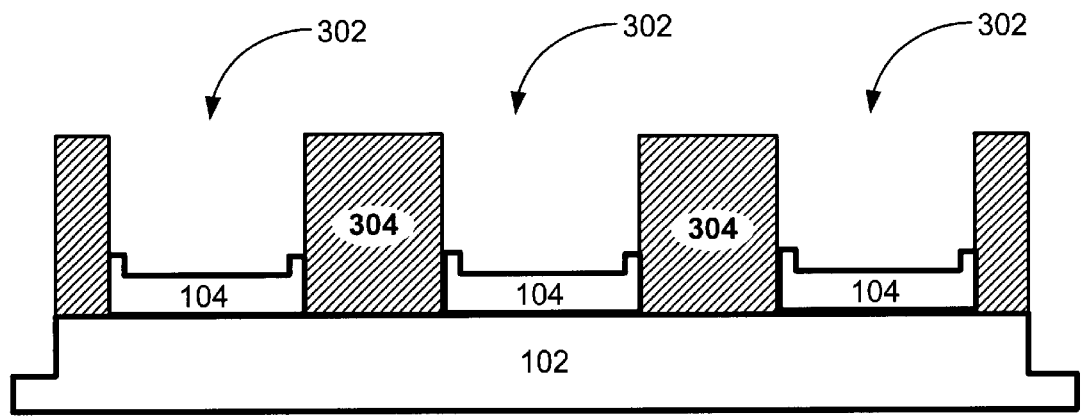
FIG. 3(a)–3(c) show cross sections of an integrated circuit located on a wafer at various stages in the process of forming a layer of underfill material according to another embodiment of the invention.
Figure 3B:
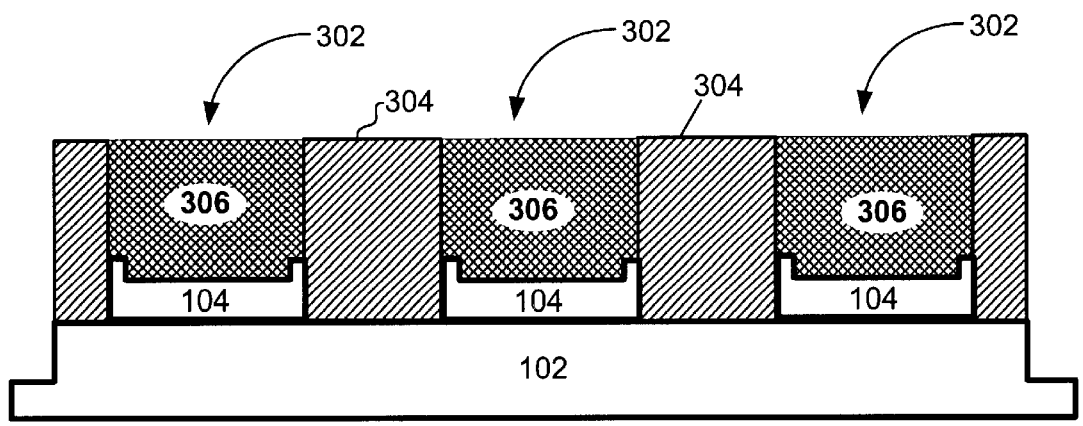
Figure 3C:
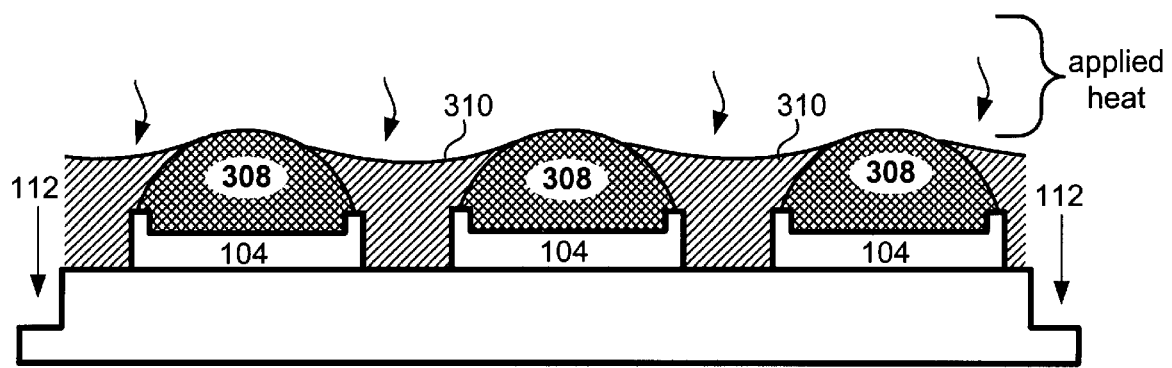

Referring now to FIG. 3(*a*) which illustrates a process for forming an underfill layer on a wafer in accordance with another embodiment of the invention. Using the wafer 100 shown having the flip chip die 102 with underbump metallization pads 104, a trench 302 is formed over the underbump metallization pad 104 by masking the wafer 100 to form underfill islands 304 using masking techniques well known to those in the art. One contemplated technique involves depositing the underfill adhesive by way of a screen printing mask. FIG. 3(*b*) shows how solder paste when deposited over the wafer 100 fills in the trench 302 forming a solder paste bump 306 covering the underbump metallization pads 104. As shown in FIG. 3(*c*), during a first solder reflow, the solder paste bump 306 forms a corresponding solder ball 308 and the underfill islands 302 form an underfill layer 310 that becomes essentially non-sticky after a subsequent soft cure operation is performed. Since the underfill layer 310 is soft cured (or gelled) at an elevated temperature, the return of the wafer 100 to ambient conditions during subsequent assembly operations results in thermally induced shear stresses between the wafer 100 and the underfill layer 310 in proportion to the thickness of the underfill layer 308. It is for at least this reason that for solder bumps that are 130 microns high before assembly and 100 microns high after assembly, an underfill layer of up to approximately 100 microns thick is desirable.

Figure 4:
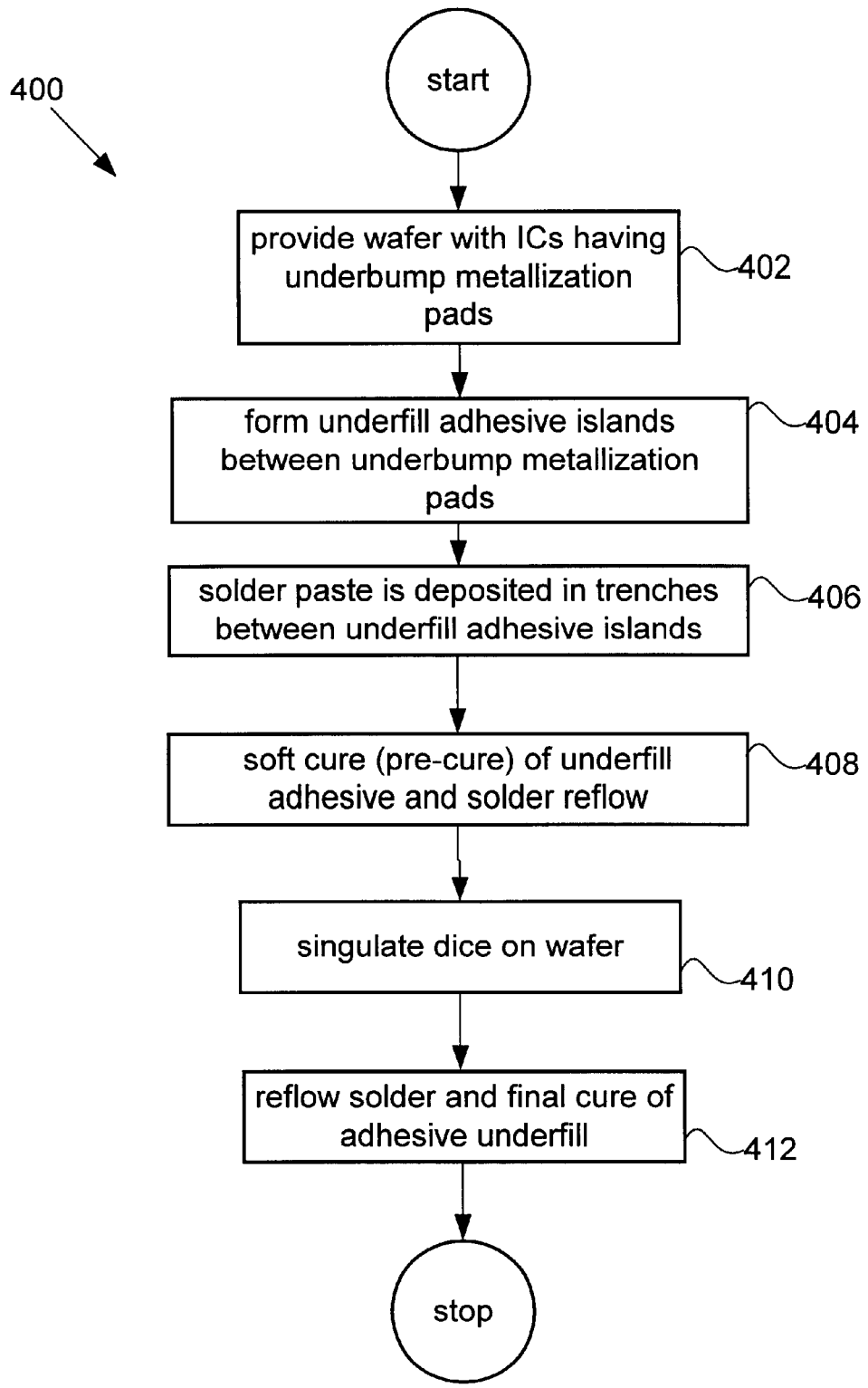
FIG. 4 is a flowchart detailing the process for forming a layer of underfill material on an integrated circuit in accordance with an embodiment of the invention.

FIG. 4 is a flowchart detailing a process 400 for forming an underfill layer in accordance with another embodiment of the invention. The process 400 begins, in one implementation, at 402 by providing a semiconductor wafer having a number of integrated circuits contained thereon each having a number of underbump metallization pads used to form bond pads. At 404, underfill adhesive islands are formed between those underbump metallization pads included within an individual die on the surface of the wafer using, for example, masking techniques. Typically, the underfill patterns are etched using a screen print technique. At 406, solder paste is deposited in trenches formed between the underfill adhesive islands forming a solder paste layer over the underbump metallization pads. At 408, a combination solder reflow and underfill gel operation are performed. At 410, the integrated circuits are singulated and at 412 a final solder reflow electrically couples the integrated circuit to a substrate.

It should be noted that in some situations a layer of underfill adhesive can be formed on a chip scale integrated circuit. In this situation, the formed layer of underfill adhesive does not substantially contact the substrate onto which the chip scale integrated circuit is eventually mounted. In this, and other cases, the layer of underfill adhesive protects the solder bumps from thermally induced stress mismatch with the substrate.

In addition to providing thermal stress relief, when the layer of underfill adhesive is substantially opaque, the associated integrated circuit, be it a flip chip, chip scale, or other, is substantially protected from photo induced leakage currents by blocking visible light.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein but may be modified within the scope of the appended claims.

What is claimed is:

1. A wafer level method for forming a layer of underfill adhesive on integrated circuits formed on an active surface of a wafer having electrically conductive pads, the method comprising:

forming solder bumps on a plurality of the electrically conductive pads;

forming an underfill adhesive layer on the active surface of the wafer by, masking selected portions of the active surface of the wafer, and depositing the underfill adhesive on the active surface of the wafer such that the masked portions of the active surface correspond to uncovered portions of the active surface that are not covered by the underfill adhesive; and partially curing the underfill adhesive layer, wherein some of the uncovered portions provide a mechanism for relieving thermally induced stress in the wafer caused in part by the partial curing, and wherein the masked portions of the active surface of the wafer include most of a plurality of saw streets that isolate adjacent integrated circuits.

2. A method as recited in claim 1 further comprising singulating the integrated circuits wherein at least one of the singulated integrated circuits is a flip chip integrated circuit suitable for encapsulation in a flip chip package wherein most of the electrically conductive pads on the flip chip integrated circuit are flip chip bond pads suitable for electrically coupling the flip chip integrated circuit to external circuitry.

3. A method as recited in claim 1, further comprising:

aligning selected ones of the solder bumped flip chip bond pads to corresponding substrate bond pads included on a substrate;

mounting the flip chip integrated circuit on the substrate such that each of the selected solder bumped flip chip bond pads are in direct contact with the corresponding substrate bond pad;

reflowing the solder bumps such that the flip chip bond pads are electrically connected to the corresponding substrate bond pads, wherein the reflowing further cures the underfill adhesive layer such that there are substantially no voided regions between the substrate and the flip chip integrated circuit and that there is substantially no segregation of any of a plurality of components that taken together form the intervening underfill adhesive.

4. A method as recited in claim 3, wherein the plurality of components include a silica filled polymer resin.

5. A method as recited in claim 1, wherein the underfill adhesive is selected from the group comprising: epoxies, poly-imides, silicone-polyimide copolymers.

6. A method for forming a layer of underfill adhesive on an integrated circuit having an active surface that includes electrically conductive pads, comprising:

forming a solder ball on most of the electrically conductive pads;

forming the layer of underfill adhesive on the active surface of the integrated circuit, wherein at least some portion of most of the solder balls remain uncovered; and partially curing the underfill adhesive, wherein the integrated circuit is a flip chip integrated circuit suitable for encapsulation in a flip chip package wherein most of the electrically conductive pads on the flip chip integrated circuit are flip chip bond pads suitable for electrically coupling the flip chip integrated circuit to external circuitry;

aligning selected ones of the solder balled flip chip bond pads to corresponding substrate bond pads included on a substrate;

mounting the flip chip integrated circuit on the substrate such that each of the selected solder bumped flip chip bond pads are in direct contact with the corresponding substrate bond pad; and reflowing the solder balls such that the flip chip bond pads are electrically connected to the corresponding substrate bond pads, wherein the reflowing further cures the underfill adhesive such that there are substantially no voided regions between the substrate and the flip chip integrated circuit and that there is substantially no segregation of the resin and the silica in the intervening underfill adhesive, wherein the layer of underfill adhesive is substantially opaque thereby protecting the flip chip integrated circuit from photo induced leakage currents by blocking visible light.

7. A method as recited in claim 6, wherein the integrated circuit is a chip scale integrated circuit.

8. A method as recited in claim 7, wherein most of the electrically conductive pads on the chip scale integrated circuit are chip scale integrated circuit bond pads suitable for electrically coupling the flip chip integrated circuit to external circuitry.

* * * * *